United States Patent
Yu

(10) Patent No.: US 10,833,143 B2
(45) Date of Patent: Nov. 10, 2020

(54) DISPLAY PANEL HAVING SHIELDING ELEMENT AND METHOD FOR MANUFACTURING THE SAME

(71) Applicant: Shenzhen China Star Optoelectronics Technology Co., Ltd., Guangdong (CN)

(72) Inventor: Wei Yu, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 336 days.

(21) Appl. No.: 14/406,580

(22) PCT Filed: Aug. 4, 2014

(86) PCT No.: PCT/CN2014/083620
§ 371 (c)(1),
(2) Date: Aug. 25, 2015

(87) PCT Pub. No.: WO2016/008178
PCT Pub. Date: Jan. 21, 2016

(65) Prior Publication Data
US 2016/0020432 A1    Jan. 21, 2016

(30) Foreign Application Priority Data
Jul. 17, 2014   (CN) .......................... 2014 1 0340495

(51) Int. Cl.
*H01L 51/52* (2006.01)
*H01L 27/32* (2006.01)

(52) U.S. Cl.
CPC ...... *H01L 27/3272* (2013.01); *H01L 51/5246* (2013.01)

(58) Field of Classification Search
CPC ............ H01L 27/3272; H01L 51/5246; H01L 51/5284
See application file for complete search history.

(56) References Cited

U.S. PATENT DOCUMENTS

2003/0064540 A1* 4/2003 Auch ...................... H01L 21/50
438/99
2004/0048033 A1   3/2004 Klausmann et al.
(Continued)

FOREIGN PATENT DOCUMENTS

CN    101533173    9/2009
CN    103293743    9/2013
(Continued)

OTHER PUBLICATIONS

International Search Report and the Written Opinion dated Apr. 20, 2015 From the State Intellectual Property Office of the People's Republic of China Re. Application No. PCT/CN2014/083620 and Its Translation of Search Report in English.

*Primary Examiner* — Lex H Malsawma
*Assistant Examiner* — Geoffrey H Ida

(57) ABSTRACT

A display panel and a method for manufacturing the same are provided. The display panel comprises a substrate, an OLED device, a cover, at least one shielding element, and a sealant. The substrate has a first surface, and the OLED device is disposed on the first surface. The cover has a second surface, and the substrate and the cover are assembled into one piece, and the first surface and the second surface face each other. The shielding element is disposed on the second surface, and the sealant is disposed between the substrate and the cover.

4 Claims, 4 Drawing Sheets

(56) References Cited

U.S. PATENT DOCUMENTS

| | | | | |
|---|---|---|---|---|
| 2004/0095060 A1* | 5/2004 | Ushifusa | ............... | H01J 1/70 |
| | | | | 313/495 |
| 2012/0267660 A1* | 10/2012 | Han | ............... | H01L 51/524 |
| | | | | 257/98 |
| 2015/0062524 A1* | 3/2015 | Kim | ............... | G02F 1/1339 |
| | | | | 349/153 |
| 2015/0223296 A1 | 8/2015 | Chen | | |

FOREIGN PATENT DOCUMENTS

| | | |
|---|---|---|
| CN | 103426903 | 12/2013 |
| JP | 2003-332046 | 11/2003 |
| JP | 2011-171187 | 9/2011 |

\* cited by examiner

104

DISPLAY PANEL HAVING SHIELDING ELEMENT AND METHOD FOR MANUFACTURING THE SAME

RELATED APPLICATIONS

This application is a National Phase of PCT Patent Application No. PCT/CN2014/083620 having International filing date of Aug. 4, 2014, which claims the benefit of priority of Chinese Patent Application No. 201410340495.2 filed on Jul. 17, 2014. The contents of the above applications are all incorporated by reference as if fully set forth herein in their entirety.

FIELD OF THE INVENTION

The present invention relates to a display technology, and more particularly to a display panel and a method for manufacturing the same.

BACKGROUND OF THE INVENTION

In a conventional package process for an organic light emitting diode (OLED) display panel, a UV-curing adhesive is coated around a glass cover, and then the glass cover and a substrate are assembled into one piece. In this manner, a sealed space is formed between the glass cover, the substrate and the UV-curing adhesive, and an organic film is positioned in the sealed space.

When using a UV lamp to emit UV rays for curing the UV-curing adhesive, the organic film is damaged by the UV rays. Therefore, when emitting the UV rays to assemble the glass cover, the substrate, the UV-curing adhesive, and the organic film, a UV mask is required to shield an OLED lighting area (corresponding to the organic film), exposing only the UV-curing adhesive for curing.

However, different UV masks are required for display panels of different sizes. Moreover, the conventional package process for the OLED display panel is performed in a N$_2$ gas chamber, and it will take more than 6 hours from opening the N$_2$ gas chamber for replacing the UV mask to return to a qualified N$_2$ environment for packaging. Therefore, the process for replacing the UV mask is very time-consuming.

As a result, it is necessary to provide a new technology to solve the problems existing in the conventional technologies as described above.

SUMMARY OF THE INVENTION

The present invention provides a display panel and a method for manufacturing the same, so as to simplify the manufacturing process and to save production time.

A primary object of the present invention is to provide a display panel, comprising: a substrate having a first surface; an organic light emitting diode (OLED) device disposed on the first surface of the substrate; a cover having a second surface, wherein the substrate and the cover are assembled into one piece, and the first surface and the second surface face each other; at least one shielding element disposed on the second surface of the cover; and a sealant disposed between the substrate and the cover. The first surface of the substrate has a display area and at least two non-display areas, and the at least two non-display areas are positioned at more than two sides of the display area, and the OLED device is disposed in the display area, and the shielding element is disposed on the second surface and corresponding to the display area, and the sealant is disposed in the non-display areas. The OLED device includes a cathode layer, an organic material layer, and an anode layer; the organic material layer is disposed between the cathode layer and the anode layer, and the OLED device is configured to display images when a voltage is applied to the organic material layer between the cathode layer and the anode layer.

In the above-mentioned display panel, the sealant is formed by using a first light to cure an adhesive in the display area.

In the above-mentioned display panel, the shielding element is configured to shield the OLED device from the first light when using the first light to cure the sealant.

In the above-mentioned display panel, the OLED device has a first projection on the first surface, and the shielding element has a second projection on the first surface, and the second projection overlaps the first projection.

In the above-mentioned display panel, the sealant has a third projection on the first surface without overlapping with the second projection.

In the above-mentioned display panel, the at least one shielding element is formed by using a photo-mask to pattern a shielding material layer on the second surface of the cover.

In the above-mentioned display panel, the cover includes marks on the second surface, and the marks are configured to position the cover and the substrate when assembling the cover and the substrate into one-piece.

In the above-mentioned display panel, the shielding elements and the marks are formed in one photo-mask process.

Another object of the present invention is to provide a display panel, comprising: a substrate having a first surface; an OLED device disposed on the first surface of the substrate; a cover having a second surface, wherein the substrate and the cover are assembled into one piece, and the first surface and the second surface face each other; at least one shielding element disposed on the second surface of the cover; and a sealant disposed between the substrate and the cover.

In the above-mentioned display panel, the first surface of the substrate has a display area and at least two non-display areas, and the at least two non-display areas are positioned at more than two sides of the display area, and the OLED device is disposed in the display area, and the shielding element is disposed on the second surface and corresponding to the display area, and the sealant is disposed in the non-display areas.

In the above-mentioned display panel, the sealant is formed by using a first light to cure an adhesive in the display area.

In the above-mentioned display panel, the shielding element is configured to shield the OLED device from the first light when using the first light to cure the sealant.

In the above-mentioned display panel, the OLED device has a first projection on the first surface, and the shielding element has a second projection on the first surface, and the second projection overlaps the first projection.

In the above-mentioned display panel, the sealant has a third projection on the first surface without overlapping with the second projection.

In the above-mentioned display panel, the at least one shielding element is formed by using a photo-mask to pattern a shielding material layer on the second surface of the cover.

In the above-mentioned display panel, the cover includes marks on the second surface, and the marks are configured to position the cover and the substrate when assembling the cover and the substrate into one-piece.

In the above-mentioned display panel, the shielding elements and the marks are formed in one photo-mask process.

Still another object of the present invention is to provide a method for manufacturing the above-mentioned display panel, comprising: forming the OLED device on the first surface of the substrate; forming the shielding element on the second surface of the cover; forming an adhesive on the substrate or the cover; assembling the substrate having the OLED device and the cover having the shielding elements into one-piece, wherein the shielding elements, the OLED device, and the adhesive are positioned between the substrate and the cover; and emitting a first light to a display area and non-display areas in the substrate and the cover, so as to cure the adhesive.

In the above-mentioned method for manufacturing the display panel, the step of forming the shielding element on the second surface of the cover comprises: forming a shielding material layer on the second surface of the cover; and using a photo-mask to pattern the shielding material layer, so as to form the shielding elements.

In the above-mentioned method for manufacturing the display panel, the step of emitting the first light to the display area and the non-display areas in the substrate and the cover comprises: using the shielding elements to shield the display area from the first light, so as to prevent the OLED device from being emitted by the first light.

In comparison with the conventional technology, with the use of the present invention, the UV mask is not required and the process for replacing the UV mask can be omitted without opening the $N_2$ gas chamber, thereby saving the time (at least 6 hours) required for replacing the qualified $N_2$ gas environment, as well as solving the position error problem between the UV mask and the glass substrate (the substrate or the cover).

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The following embodiments are referring to the accompanying drawings for exemplifying specific implementable embodiments of the present invention.

Figure 1:
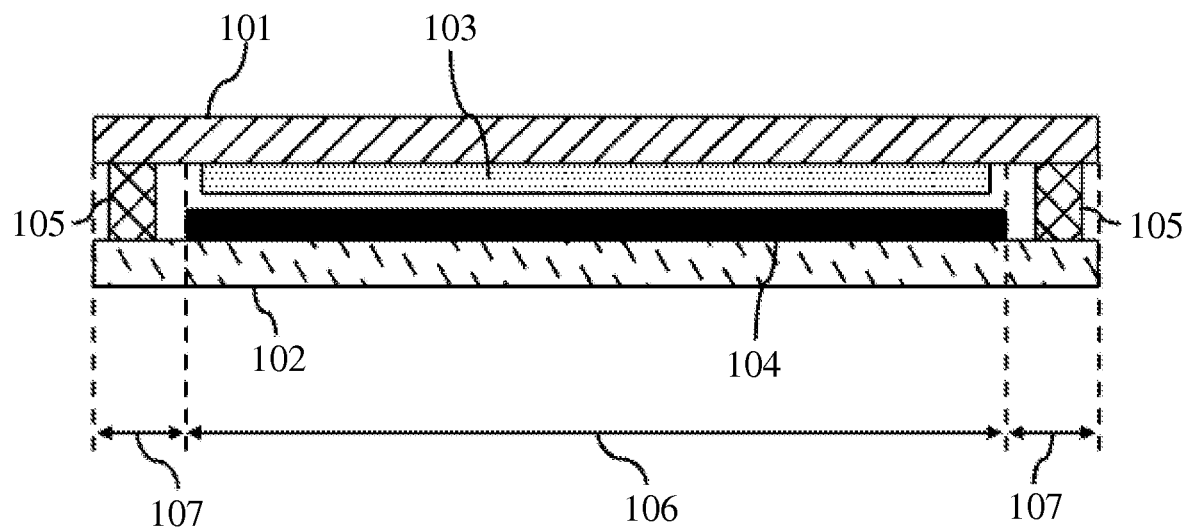
FIG. 1 is a schematic diagram showing a display panel according to an embodiment of the present invention.

FIG. 1 is a schematic diagram showing a display panel according to an embodiment of the present invention.

The display panel comprises a substrate 101, a cover 102, an OLED device 103, at least one shielding element 104, and at least one sealant 105.

The substrate 101 can be a transparent substrate (such as a glass substrate) and has a first surface, and the OLED device 103 is disposed on the first surface of the substrate 101. The OLED device 103 includes a cathode layer, an organic material layer, and an anode layer; the organic material layer is disposed between the cathode layer and the anode layer. The OLED device 103 is configured to display images when a voltage is applied to the organic material layer between the cathode layer and the anode layer, and the images can be shown from the transparent substrate.

The cover 102 has a second surface, and the substrate 101 and the cover 102 can be assembled into one piece, and the first surface of the substrate 101 is opposite the second surface of the cover 102. That is, the first surface and the second surface face each other. The at least one shielding element 104 is disposed on the second surface of the cover 102, and the sealant 105 is disposed between the substrate 101 and the cover 102 for sealing a space formed between the substrate 101 and the cover 102. In particular, the sealant 105 is configured to seal the OLED device 103 between the substrate 101 and the cover 102.

In this embodiment, the first surface of the substrate 101 has a display area 106 and at least two non-display areas 107, and the at least two non-display areas 107 are positioned at more than two sides of the display area 106. The OLED device 103 is disposed in the display area 106, and the shielding element 104 is disposed on the second surface and corresponding to the display area 106, and the sealant 105 is disposed in the non-display areas 107.

In this embodiment, the sealant 105 is formed by using a first light (such as a UV light) to cure an adhesive in the display area 106.

In this embodiment, the shielding element 104 is configured to shield the OLED device 103 from the first light when using the first light to cure the sealant 105.

In this embodiment, the OLED device 103 has a first projection on the first surface, and the shielding element 104 has a second projection on the first surface, and the second projection can completely overlap or cover the first projection. That is, in a direction perpendicular to the first surface, the shielding element 104 can completely cover or shield the OLED device 103. The sealant 105 has a third projection on the first surface without overlapping with the second projection. That is, in the direction perpendicular to the first surface, the sealant 105 (the adhesive) is not shielded by the shielding element 104.

Figure 2:
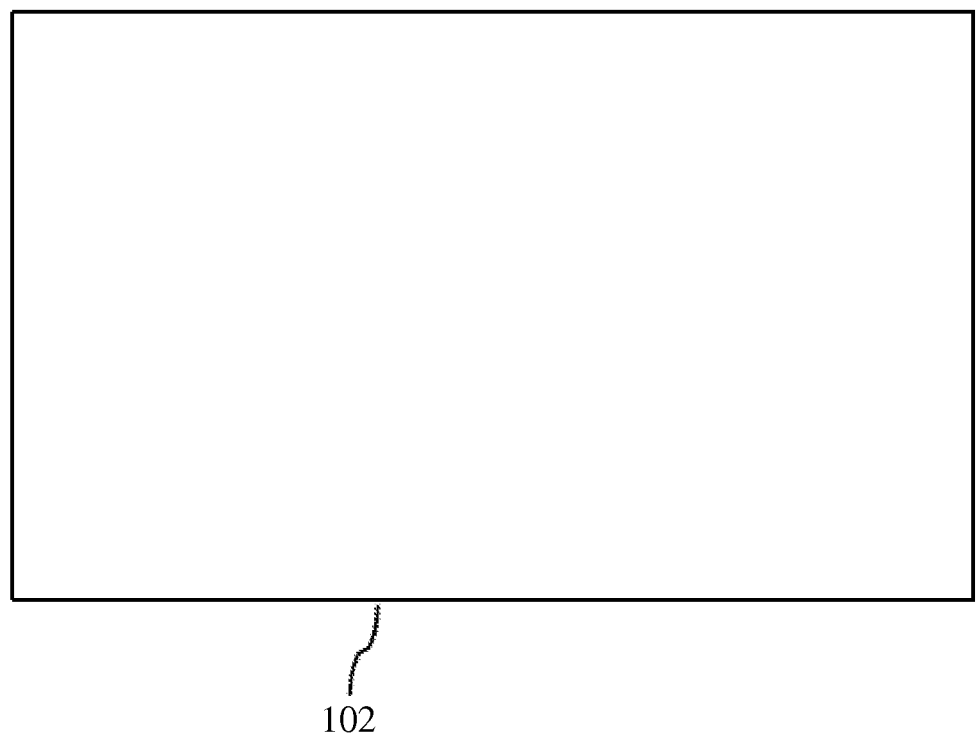
FIG. 2 is a schematic diagram showing the cover without being assembled to the substrate.
Figure 3:
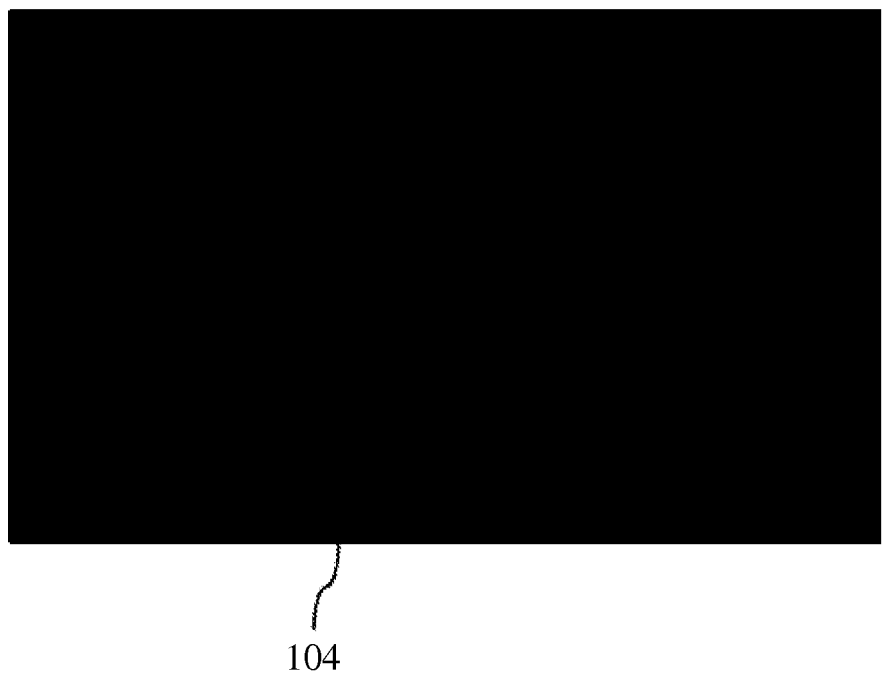
FIG. 3 is a schematic diagram showing a shielding material layer on the cover.
Figure 4:
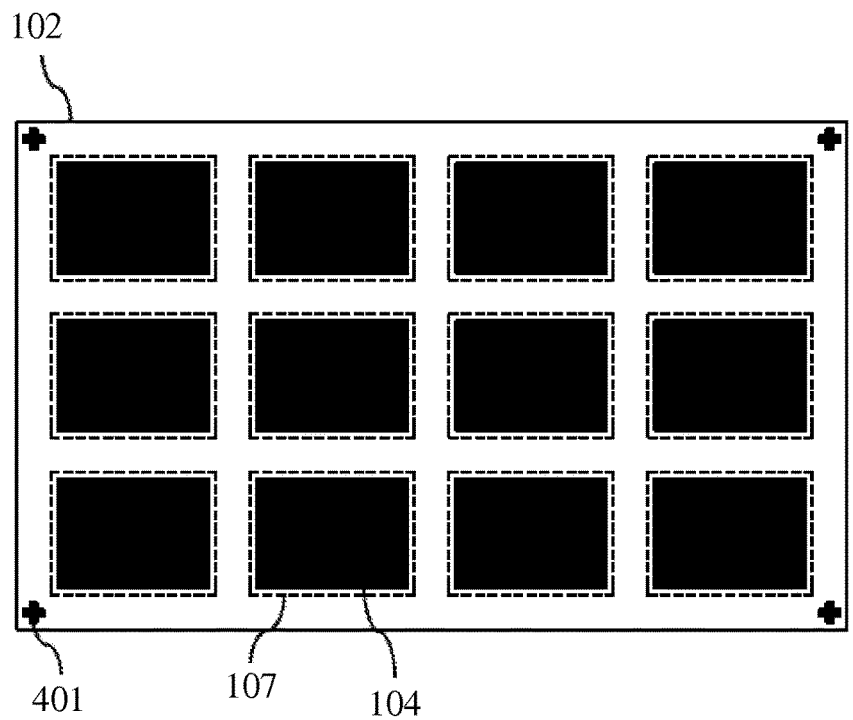
FIG. 4 is a schematic diagram showing shielding elements on the cover by patterning the shielding material layer.

Referring to FIG. 2 through FIG. 4, FIG. 2 is a schematic diagram showing the cover 102 without being assembled to substrate, FIG. 3 is a schematic diagram showing a shielding material layer on the cover 102, and FIG. 4 is a schematic diagram showing shielding elements on the cover 102 by patterning the shielding material layer.

In this embodiment, the shielding elements 104 are formed by using a photo-mask to pattern the shielding material layer (such as a black matrix layer) on the second surface of the cover 102.

More specifically, as shown in FIG. 2, the cover 102 is provided. As shown in FIG. 3, the shielding material layer is formed on the second surface of the cover 102 by coating, depositing and/or sputtering. Thereafter, the photo-mask is used to pattern the shielding material layer, so as to form at least one first predetermined pattern and at least one second predetermined pattern. Herein, the first predetermined pattern corresponds to the shape and area of the shielding elements 104, and the second predetermined pattern corresponds to the shape and area of marks 401 of the cover 102. The marks 401 are configured to position the cover 102 and the substrate 101 when assembling the cover 102 and the substrate 101 into one piece. Thereafter, in addition to the first predetermined pattern and second predetermined pattern, the other portions of the shielding material layer are removed from the cover 102, so as to form the shielding elements 104.

In other words, the shielding elements 104 and the marks 401 for positioning the cover 102 and the substrate 101 can be formed by the same photo-mask (in one photo-mask process).

In addition, after assembling the substrate 101 having the OLED device 103 and the cover 102 having the shielding elements 104, and curing the sealant, the cover 102 and the substrate 101 can be cut or diced into a plurality of display panels, as shown in FIG. 1.

In that manner, the adhesive of the sealant can be cured without an additional UV mask, thereby solving a position error problem between the UV mask and the cover 102, as well as solving a mask replacing problem when replacing the UV mask in the $N_2$ gas chamber. In that manner, the first light can be directly emitted to the cover 102 for curing the adhesive of the sealant without the additional UV mask, thereby reducing the process time and steps for manufacturing the display panel. Furthermore, it is not required to replace the qualified $N_2$ gas environment for packaging after changing the UV mask from a $N_2$ gas chamber, thereby saving the process time (at least 6 hours) required for manufacturing the display panel.

Figure 5:
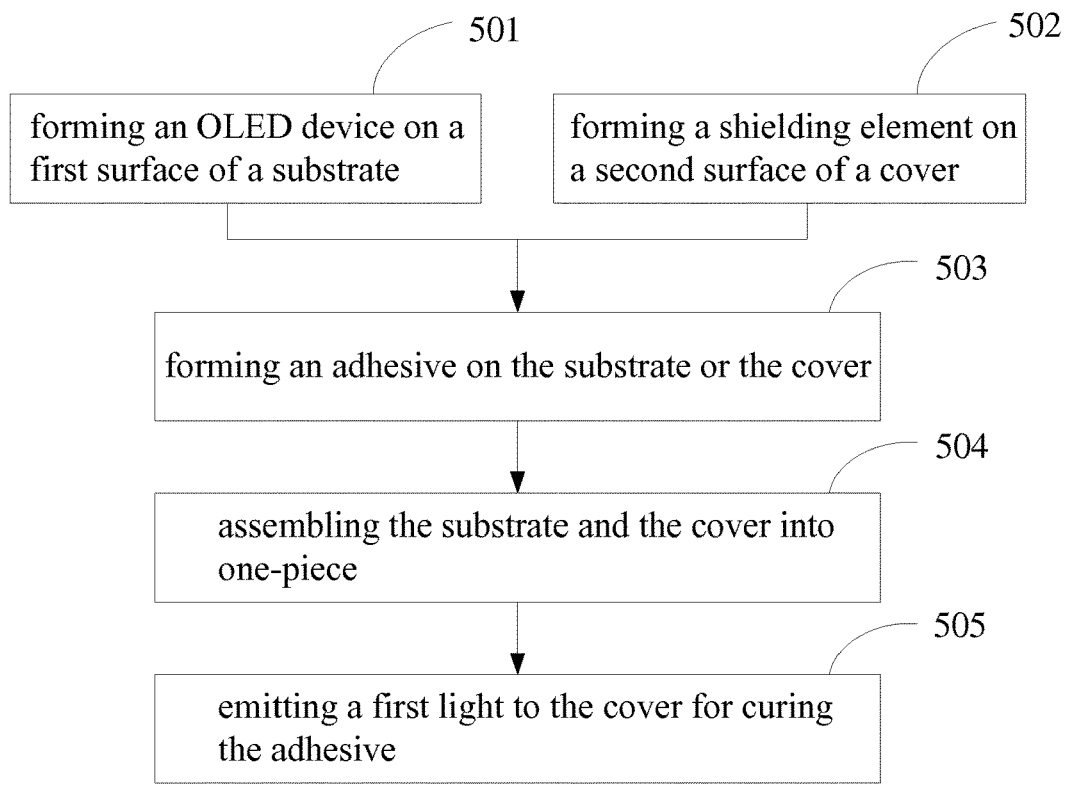
FIG. 5 is a flowchart showing a method for manufacturing the display panel according to an embodiment of the present invention.
Figure 6:
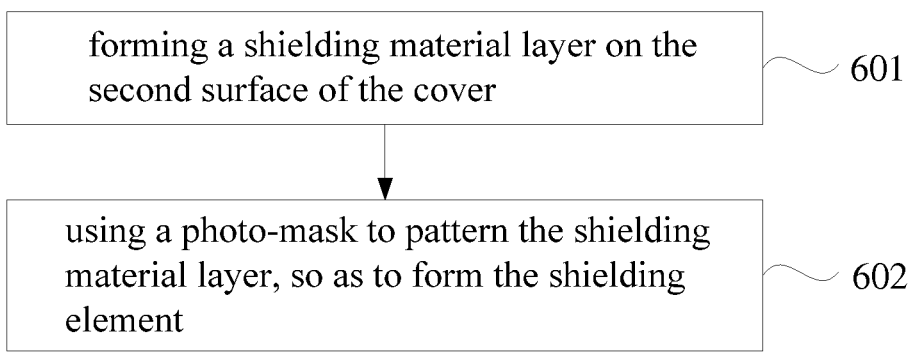
FIG. 6 is a flowchart showing steps for forming the shielding elements on the second surface of the cover.

Referring to FIGS. 5 and 6, FIG. 5 is a flowchart showing a method for manufacturing the display panel according to an embodiment of the present invention, and FIG. 6 is a flowchart showing steps for forming the shielding elements 104 on the second surface of the cover 102.

In this embodiment, the method for manufacturing the display panel comprises the following steps.

In a step 501, the OLED device 103 is formed on the first surface of the substrate 101.

In a step 502, the shielding element 104 is formed on the second surface of the cover 102.

In a step 503, an adhesive is formed on the substrate 101 or the cover 102.

In a step 504, the substrate 101 having the OLED device 103 and the cover 102 having the shielding elements 104 are assembled into one piece, wherein the shielding elements 104, the OLED device 103, and the adhesive are positioned between the substrate 101 and the cover 102.

In a step 505, the first light is emitted to the display area 106 and the non-display areas 107 in the substrate 101 and the cover 102, so as to cure the adhesive of the sealant.

Herein, the step 501 and the step 502 can be performed regardless of the order. That is, the step 501 and the step 502 can be performed simultaneously or sequentially.

In addition, after assembling the substrate 101 having the OLED device 103 and the cover 102 having the shielding elements 104, and curing the sealant, the cover 102 and the substrate 101 can be cut or diced into a plurality of display panels, as shown in FIG. 1.

In this embodiment, the step of forming the shielding element 104 on the second surface of the cover 102 (i.e. the step 502) comprises the following steps.

In a step 601, the shielding material layer is formed on the second surface of the cover 102.

In a step 602, the photo-mask is used to pattern the shielding material layer, so as to form the shielding elements 104.

More specifically, as shown in FIG. 2, the cover 102 is provided. As shown in FIG. 3, the shielding material layer is formed on the second surface of the cover 102 by coating, depositing and/or sputtering. Thereafter, the photo-mask is used to pattern the shielding material layer, so as to form the at least one first predetermined pattern and the at least one second predetermined pattern. Herein, the first predetermined pattern corresponds to the shape and area of the shielding elements 104, and the second predetermined pattern corresponds to the shape and area of marks 401 of the cover 102. The marks 401 are configured to position the cover 102 and the substrate 101 when assembling the cover 102 and the substrate 101 into one piece. Thereafter, in addition to the first predetermined pattern and second predetermined pattern, the other portions of the shielding material layer are removed from the cover 102, so as to form the shielding elements 104.

The shielding elements 104 and the marks 401 can be formed in one photo-mask process, wherein the marks 401 are configured to position the cover 102 and the substrate 101.

In this embodiment, when emitting the first light to the display area 106 and the non-display areas 107 in the substrate 101 and the cover 102, the shielding elements 104 are used to shield or cover the display area 106 from the first light, so as to prevent the OLED device 103 from being emitted by the first light.

In that manner, the adhesive of the sealant can be cured without an additional UV mask, thereby solving a position error problem between the UV mask and the cover 102, as well as solving a mask replacing problem when replacing the UV mask in the $N_2$ chamber. In that manner, the first light can be directly emitted to the cover 102 for curing the adhesive of the sealant without the additional UV mask, thereby reducing the process time and steps for manufacturing the display panel. Furthermore, it is not required to replace the qualified $N_2$ gas environment for packaging after changing the UV mask from a $N_2$ gas chamber, thereby saving the process time (at least 6 hours) required for manufacturing the display panel.

In the present invention, the shielding elements 104 and the marks 401 on the package cover 102 can be formed in one photo-mask process, wherein the shielding elements 104 are configured to replace the UV mask for shielding UV rays.

After assembling the substrate 101 having the OLED device 103 and the cover 102 having the shielding elements 104 into one piece, the shielding elements 104 can shield or cover the OLED device 103 (the organic material layer or organic film), and the adhesive of the at least one sealant 105 around the OLED device 103 can be exposed to be cured by the UV rays. For the display panels of different sizes, the shielding elements 104 of corresponding sizes can be formed. Therefore, the UV mask is not required and the process for replace the UV mask can be omitted without opening the $N_2$ gas chamber, thereby saving the time (at least 6 hours) required for replacing the qualified $N_2$ gas environment, as well as solving the position error problem between the UV mask and the glass substrate (the substrate 101 or the cover 102).

The present invention has been described with preferred embodiments thereof and it is understood that many changes and modifications to the described embodiments can be carried out without departing from the scope and the spirit of the invention that is intended to be limited only by the appended claims.

What is claimed is:

1. A display panel, comprising:
   a substrate having a first surface;
   an organic light emitting diode (OLED) device disposed on the first surface of the substrate;
   a cover having a second surface, wherein the substrate and the cover are assembled into one piece, and the first surface and the second surface face each other;
   at least one shielding element disposed on the second surface of the cover; and
   a sealant disposed between the substrate and the cover, wherein the sealant is entirely made of a light-curing adhesive;
   wherein the first surface of the substrate has a display area and at least two non-display areas; and the at least two non-display areas are positioned at more than two sides of the display area, and the OLED device is disposed in the display area, and the shielding element is disposed on the second surface and corresponding to the display area but not corresponding to the non-display areas, and the sealant is disposed in the non-display areas but is not disposed in the display area, and the shielding element completely covers the OLED device to protect it from light to cure the sealant;
   wherein the OLED device includes a cathode layer, an organic material layer and an anode layer, and the organic material layer is disposed between the cathode layer and the anode layer; and the OLED device is configured to display images when a voltage is applied to the organic material layer between the cathode layer and the anode layer;
   wherein the OLED device has a first projection on the first surface, and the shielding element has a second projection on the first surface, and the second projection overlaps the first projection; and
   wherein the sealant has a third projection on the first surface, and the third projection does not have any portion overlapping with the second projection.

2. The display panel according to claim 1, wherein the cover includes marks on the second surface, and the marks are configured to position the cover and the substrate when assembling the cover and the substrate into one piece.

3. A display panel, comprising:
   a substrate having a first surface;
   an OLED device disposed on the first surface of the substrate;
   a cover having a second surface, wherein the substrate and the cover are assembled into one piece, and the first surface and the second surface face each other;
   at least one shielding element disposed on the second surface of the cover; and
   a sealant disposed between the substrate and the cover, wherein the sealant is entirely made of a light-curing adhesive;
   wherein the first surface of the substrate has a display area and at least two non-display areas, and the at least two non-display areas are positioned at more than two sides of the display area, and the OLED device is disposed in the display area, and the shielding element is disposed on the second surface and corresponding to the display area but not corresponding to the non-display areas, and the sealant is disposed in the non-display areas but is not disposed in the display area, and the shielding element completely covers the OLED device to protect it from light to cure the sealant;
   wherein the OLED device has a first projection on the first surface, and the shielding element has a second projection on the first surface, and the second projection overlaps the first projection; and
   wherein the sealant has a third projection on the first surface, and the third projection does not have any portion overlapping with the second projection.

4. The display panel according to claim 3, wherein the cover includes marks on the second surface, and the marks are configured to position the cover and the substrate when assembling the cover and the substrate into one piece.

* * * * *